United States Patent
Kim et al.

(10) Patent No.: US 11,315,608 B2
(45) Date of Patent: Apr. 26, 2022

(54) SEMICONDUCTOR DEVICE AND SEMICONDUCTOR MEMORY DEVICE

(71) Applicant: SK hynix Inc., Icheon-si (KR)

(72) Inventors: Jae In Kim, Icheon-si (KR); Hyun Chul Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/076,515

(22) Filed: Oct. 21, 2020

(65) Prior Publication Data
US 2021/0375331 A1    Dec. 2, 2021

(30) Foreign Application Priority Data
May 28, 2020    (KR) .................. 10-2020-0064039

(51) Int. Cl.
*G11C 5/14*    (2006.01)
(52) U.S. Cl.
CPC .................... *G11C 5/147* (2013.01)
(58) Field of Classification Search
CPC .................................................... G11C 5/147
See application file for complete search history.

(56) References Cited

U.S. PATENT DOCUMENTS

| | | | | |
|---|---|---|---|---|
| 2015/0130533 | A1* | 5/2015 | Jeon ................ | G11C 5/147 327/540 |
| 2016/0054361 | A1* | 2/2016 | Lee ................ | G11C 5/148 365/185.11 |
| 2016/0133302 | A1* | 5/2016 | Son ................ | G11C 8/08 365/226 |
| 2019/0279687 | A1* | 9/2019 | Lee ................ | G11C 5/147 |

FOREIGN PATENT DOCUMENTS

| KR | 1020080061955 A | 7/2008 |
|---|---|---|
| KR | 1020160054238 A | 5/2016 |

* cited by examiner

*Primary Examiner* — Khamdan N. Alrobaie
(74) *Attorney, Agent, or Firm* — William Park & Associates Ltd.

(57) ABSTRACT

A semiconductor device may include a sudden power detection circuit and an operation circuit. The sudden power detection circuit may generate a power-off control signal in a sudden power-off state. The operation circuit may discharge a specific node based on the power-off control signal.

12 Claims, 4 Drawing Sheets

SEMICONDUCTOR DEVICE AND SEMICONDUCTOR MEMORY DEVICE

CROSS-REFERENCE TO RELATED APPLICATION

This application claims priority under 35 U.S.C. § 119 to Korean Patent Application No. 10-2020-0064039 filed on May 28, 2020, which is incorporated herein by reference in its entirety.

BACKGROUND

1. Field

Exemplary embodiments relate to a semiconductor device and a semiconductor memory device, and particularly, to a semiconductor device and a semiconductor memory device operating using an internal power source voltage generated based on an external power source voltage.

2. Discussion of the Related Art

In general, a semiconductor device performs a circuit operation by using an internal power source voltage that is generated based on an external power source voltage. Likewise, a volatile memory device and a nonvolatile memory device, that is, semiconductor memory devices, also perform circuit operations by using an internal power source voltage that is generated based on an external power source voltage.

The volatile memory device has an advantage in that the data processing speed is high, which is the speed at which external data is stored therein or internal data is output to an external device. Furthermore, the volatile memory device has a disadvantage in that it continues to be supplied with an external power source voltage in processing data. In contrast, the nonvolatile memory device has a disadvantage in that it has a low data processing speed. Furthermore, the nonvolatile memory device has an advantage in that it retains data already stored therein although an external power source voltage is not supplied.

In this case, the nonvolatile memory device performs a to program operation in order to store data in a memory cell and performs a read operation in order to output data that is stored in a memory cell. Furthermore, the nonvolatile memory device performs an erasing operation in order to erase data, stored in a memory cell, prior to a program operation. As described above, the nonvolatile memory device retains data that is already stored therein although an external power source voltage is not supplied. However, if an external power is not smoothly supplied during a program operation, a read operation, or an erasing operation, the data that is stored in a memory cell may be damaged.

More specifically, in the nonvolatile memory device, during a program operation, a read operation or an erasing operation, a high voltage may be applied to a word line, a bit line or a source line. Accordingly, if an external power source voltage is not smoothly supplied during the program operation, the read operation or the erasing operation, a voltage level of the high voltage applied to a that corresponds line may be unwillingly lowered. In this case, a distribution of data that is stored in a memory cell coupled to the corresponding line is influenced by an unwillingly lowered voltage level. A change in the data distribution of the memory cell means that the reliability of data that is stored in the memory cell cannot be guaranteed.

Hereinafter, for convenience of description, the state in which an external power source voltage is not smoothly supplied, that is, the state in which a voltage level of the external power source to voltage is lowered to a preset voltage level or less, is called a "sudden power-off state."

SUMMARY

In an embodiment, a semiconductor device may include a sudden power detection circuit configured to generate a power-off control signal with a voltage level that corresponds to a voltage level of an external power source voltage, in a sudden power-off state and an operation circuit configured to discharge a specific node during an enable period of the power-off control signal.

In an embodiment, a semiconductor device may include a voltage detection circuit configured to enable a power-off control signal by detecting a voltage level of an external power source voltage, an internal voltage generation circuit configured to receive the external power source voltage, generate an internal power source voltage by comparing the external power source voltage to a preset reference voltage, and drive the internal power source voltage as the external power source voltage during an enable period of the power-off control signal, and a control signal generation circuit configured to generate a control signal with a voltage level that corresponds to a voltage level of the internal power source voltage and configured to control a circuit operation of the voltage detection circuit.

In an embodiment, a semiconductor memory device may include a sudden power detection circuit configured to generate a power-off control signal with a voltage level that corresponds to a voltage level of an external power source voltage, in a sudden power-off state, a memory cell array configured to store data, and the memory cell including a memory cell, having a gate coupled to a word line, coupled between a bit line and a source line, and a discharging driving circuit configured to discharge at least one of the bit line, the source line, and the word line during an enable period of the power-off control signal.

DETAILED DESCRIPTION

Figure 1:
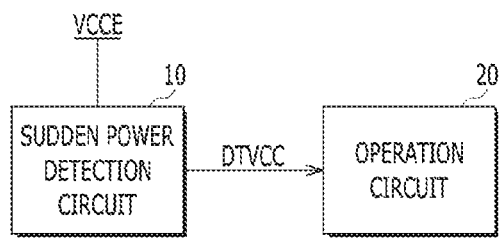
FIG. 1 is a block diagram for illustrating a configuration of a semiconductor device according to an embodiment.

The description of the present disclosure is merely an to embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the 'second", are used to distinguish one element from another element, and the scope of rights of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have", should be understood as indicating the existence of a set characteristic, number, step, operation, element, part, or a combination thereof, not excluding a possibility of the existence or addition of one or more other characteristics, numbers, steps, operations, elements, parts, or to a combination thereof.

In each of steps, symbols (e.g., a, b, and c) are used for convenience of description, and the symbols do not describe order of the steps. The steps may be performed in order different from order described in the context unless specific order is clearly described in the context. That is, the steps may be performed according to described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as having the same meanings as those in the context in related technology and should not be construed as having ideal or excessively formal meanings, unless clearly defined in the application.

Prior to the description, a semiconductor device and semiconductor memory device according to an embodiment may discharge a specific node in the sudden power-off state. Furthermore, a semiconductor memory device according to an embodiment may discharge at least one of a word line, a source line and a bit line in the sudden power-off state.

Various embodiments are directed to the provision of a semiconductor device capable of stably generating a power-off control signal, that is, a detection signal, in a sudden power-off state.

Also, various embodiments are directed to the provision of a semiconductor device capable of guaranteeing a smooth discharging operation for a circuit that attempts to perform a circuit operation in a sudden power-off state.

Also, various embodiments are directed to the provision of a semiconductor memory device capable of guaranteeing a stable discharging operation for each of lines configuring a memory cell array in a sudden power-off state.

Objects of the present disclosure are not limited to the aforementioned objects, and other objects not described above may be evidently understood by those skilled in the art, to which the present disclosure pertains, from the following description.

FIG. 1 is a block diagram for illustrating a configuration of a semiconductor device according to an embodiment.

Referring to FIG. 1, the semiconductor device may include a sudden power detection circuit 10 and an operation circuit 20.

First, in the sudden power-off state, the sudden power detection circuit 10 may be an element that generates a power-off control signal DTVCC with a voltage level that corresponds to a voltage level of an external power source voltage VCCE. In this case, the power-off control signal DTVCC may be a signal that is enabled at a logic level "high" in the sudden power-off state. Furthermore, during the enabling, the power-off control signal DTVCC may have a voltage level that corresponds to a voltage level of the external power source voltage VCCE.

For reference, the sudden power-off state may mean the state in which the external power source voltage is not smoothly supplied, that is, the state in which the voltage level of the external power source voltage is lowered to a preset voltage level or less, as described above.

The operation circuit 20 may be an element that discharges a specific node during the enable period of the power-off control signal DTVCC. The operation circuit 20 may correspond to a circuit that belongs to various circuits that are included in the semiconductor device and that performs a discharging operation on a specific node based on the power-off control signal DTVCC.

The semiconductor device may generate the power-off control signal DTVCC based on the external power source voltage VCCE in the sudden power-off state. Accordingly, the power-off control signal DTVCC may have a voltage level that corresponds to a voltage level of the external power source voltage VCCE, regardless of an internal power source voltage. As a result, the operation circuit 20 to which the power-off control signal DTVCC is supplied may secure a smooth operation in the sudden power-off state.

Figure 2:
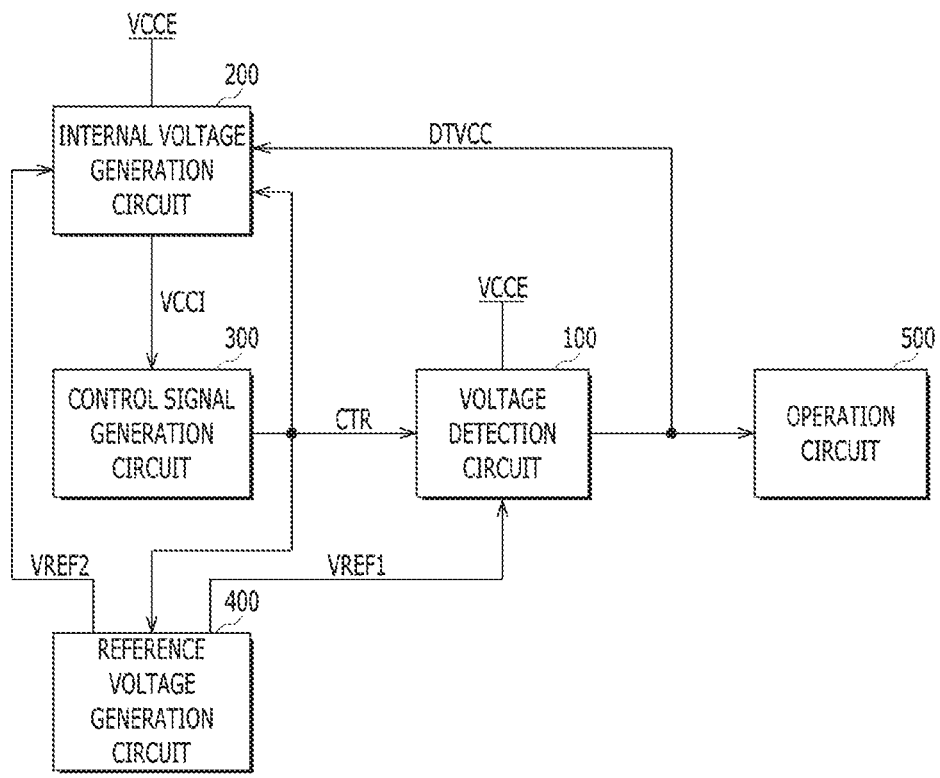
FIG. 2 is a block diagram for illustrating a configuration of a semiconductor device according to an embodiment.

FIG. 2 is a block diagram for illustrating a configuration of a semiconductor device according to an embodiment.

Referring to FIG. 2, the semiconductor device may include a voltage detection circuit 100, an internal voltage generation circuit 200, and a control signal generation circuit 300. Furthermore, the semiconductor device may include a reference voltage generation circuit 400 and an operation circuit 500.

First, the voltage detection circuit 100 may be an element that enables the power-off control signal DTVCC by detecting the voltage level of the external power source voltage VCCE. The voltage detection circuit 100 may receive a first reference voltage VREF1 and may generate the power-off control signal DTVCC by comparing the first reference voltage VREF1 with the external power source voltage VCCE. Accordingly, when the external power source voltage VCCE is lower than the first reference voltage VREF1, that is, in the sudden power-off state, the voltage detection circuit 100 may enable the power-off control signal DTVCC.

In this case, a control signal CTR that is input to the voltage detection circuit 100 may control whether to enable a detection operation of the voltage detection circuit 100. Furthermore, the control signal CTR may control an initialization operation of the voltage detection circuit 100 based on a circuit configuration of the voltage detection circuit 100. A detailed operation of the control signal CTR is described more specifically with reference to FIG. 3.

The internal voltage generation circuit 200 may be an element that receives the external power source voltage VCCE in a normal operation state and generates an internal power source voltage VCCI. In this case, the normal operation state means a circuit operation state in a section that is not in the sudden power-off state. In other words, the internal voltage generation circuit 200 may receive a second reference voltage VREF2, that is, a preset voltage, in the to normal operation state, and may generate the internal power source voltage VCCI by comparing the second reference voltage VREF2 and the external power source voltage VCCE.

Furthermore, the internal voltage generation circuit 200 may be an element that drives the internal power source voltage VCCI as the external power source voltage VCCE during the enable period of the power-off control signal DTVCC. In this case, a control signal CTR that is input to the internal voltage generation circuit 200 may control whether to enable the voltage generation operation of the internal voltage generation circuit 200. Furthermore, the control signal CTR may control the initialization operation of the internal voltage generation circuit 200 based on a circuit configuration of the internal voltage generation circuit 200. A detailed operation of the control signal CTR is described more specifically with reference to FIG. 4.

The control signal generation circuit 300 may be an element that controls the circuit operation of the voltage detection circuit 100 by generating a control signal CTR with a voltage level that corresponds to the voltage level of the internal power source voltage VCCI. In this case, the control signal CTR may be a signal that controls an enable operation or initialization operation of the voltage detection circuit 100. An example in which the control signal CTR controls the enable operations of the voltage detection circuit 100 and the internal voltage generation circuit 200 is described below.

The control signal CTR at a logic level "high" that is generated to by the control signal generation circuit 300 may have a voltage level that corresponds to the voltage level of the internal power source voltage VCCI that is generated by the internal voltage generation circuit 200. The control signal CTR at a logic level "low" may have a voltage level that corresponds to a voltage level of a ground power source voltage VSS. In other words, as described above, in the sudden power-off state, the internal voltage generation circuit 200 may drive the internal power source voltage VCCI as the external power source voltage VCCE based on the power-off control signal DTVCC. Furthermore, the internal power source voltage VCCI that is driven as the external power source voltage VCCE may be applied to the control signal generation circuit 300. Accordingly, the control signal CTR at a logic level "high" that is generated by the control signal generation circuit 300 may have a voltage level of the external power source voltage VCCE.

The semiconductor device may drive the internal power source voltage VCCI, generated by the internal voltage generation circuit 200, as the external power source voltage VCCE by using the power-off control signal DTVCC enabled in the sudden power-off state. In other words, in the sudden power-off state, the internal power source voltage VCCI may be driven as the external power source voltage VCCE. Accordingly, the control signal CTR that is generated by the control signal generation circuit 300 may have a voltage level that corresponds to a voltage level of the external power source voltage VCCE. Accordingly, the voltage detection circuit 100 that is enabled to based on the control signal CTR may stably generate a desired power-off control signal DTVCC in the sudden power-off state.

The reference voltage generation circuit 400 may be an element that enables a voltage generation operation based on the control signal CTR and generates the first and second reference voltages VREF1 and VERF2. The reference voltage generation circuit 400 may be implemented as a bandgap reference circuit. The first reference voltage VREF1 that is generated by the reference voltage generation circuit 400 may be provided to the voltage detection circuit 100. The second reference voltage VREF2 that is generated by the reference voltage generation circuit 400 may be provided to the internal voltage generation circuit 200. In this case, the control signal CTR may be a signal that controls an enable operation or an initialization operation of the reference voltage generation circuit 400.

The operation circuit 500 may be an element that discharges a specific node during the enable period of the power-off control signal DTVCC. The operation circuit 500 may correspond to a circuit that belongs to various circuits that is included in the semiconductor device and that performs a discharging operation on a specific node based on the power-off control signal DTVCC. A detailed configuration and operation of the circuit performing the discharging operation is described more specifically with reference to FIG. 5.

Figure 3:
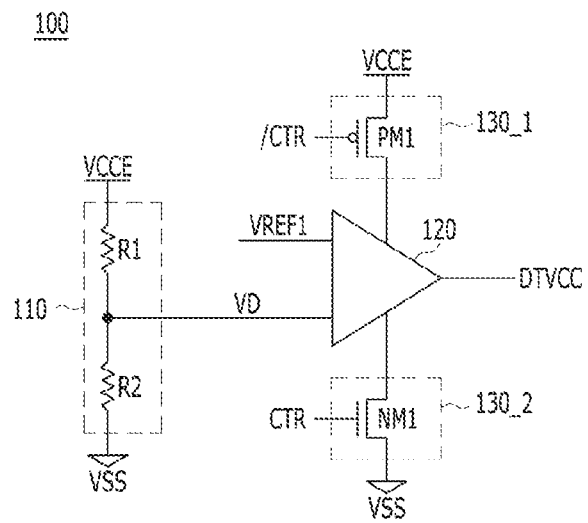
FIG. 3 is a diagram for illustrating a configuration of a voltage detection circuit of FIG. 2.

FIG. 3 is a diagram for illustrating a configuration of the voltage detection circuit 100 of FIG. 2.

Referring to FIG. 3, the voltage detection circuit 100 may to include a distribution circuit 110, a comparison circuit 120, and enable circuits 130_1 and 130_2.

First, the distribution circuit 110 may be an element that generates a distribution voltage VD by dividing a voltage level of the external power source voltage VCCE. More specifically, the distribution circuit 110 may include first and second resistors R1 and R2 that are coupled in series between a power source stage to which the external power source voltage VCCE is applied and a ground stage to which the ground power source voltage VSS is applied. Accordingly, the distribution voltage VD that is generated by the distribution circuit 110 may be output from a common node to which the first resistor R1 and the second resistor R2 are coupled.

The comparison circuit 120 may be an element that generates the power-off control signal DTVCC by comparing the distribution voltage VD, output by the distribution circuit 110, and the first reference voltage VREF1. More specifically, the comparison circuit 120 may receive the first reference voltage VREF1 through one input stage, may receive the distribution voltage VD through the other input stage, and may generate the power-off control signal DTVCC through an operation of comparing the first reference voltage VREF1 and the distribution voltage VD. Accordingly, the comparison circuit 120 may generate the power-off control signal DTVCC that is enabled when a voltage level of the distribution voltage VD is lower than a voltage level of the first reference voltage VREF1.

The enable circuits 130_1 and 130_2 may be elements that control an enable operation of the comparison circuit 120 based on the control signal CTR output by the control signal generation circuit 300 of FIG. 2. More specifically, the enable circuits 130_1 and 130_2 may include a first PMOS transistor PM1 with a source and a drain that are coupled between the comparison circuit 120 and a supply stage to which the external power source voltage VCCE is applied, and the enable circuits 130_1 and 130_2 may include a first NMOS transistor NM1 with a source and a drain that are coupled between the comparison circuit 120 and the ground stage to which the ground power source voltage VSS is applied, respectively. In this case, the first PMOS transistor PM1 may receive a negative control signal /CTR with a logic level that is opposite of the logic level of the control signal CTR, through a gate thereof, and may perform a turn-on/off operation. Furthermore, the first NMOS transistor NM1 may receive the control signal CTR through a gate thereof and perform a turn-on/off operation. Accordingly, when the first PMOS transistor PM1 and the first NMOS transistor NM1 are turned on based on the negative control signal /CTR and the control signal CTR, respectively, the comparison circuit 120 may be enabled to perform an operation of comparing the distribution voltage VD and the first reference voltage VREF1.

Through the aforementioned configuration, the voltage detection circuit 100 may generate the distribution voltage VD that corresponds to the external power source voltage VCCE, and may generate the power-off control signal DTVCC through the comparison operation enabled by the control signal CTR.

As described above, the control signal CTR generated by the semiconductor device may have a voltage level that corresponds to a voltage level of the internal power source voltage VCCI that is driven as the external power source voltage VCCE in the sudden power-off state. Accordingly, the voltage detection circuit 100 may generate a stable power-off control signal DTVCC because the comparison circuit 120 is smoothly enabled in the sudden power-off state.

Figure 4:
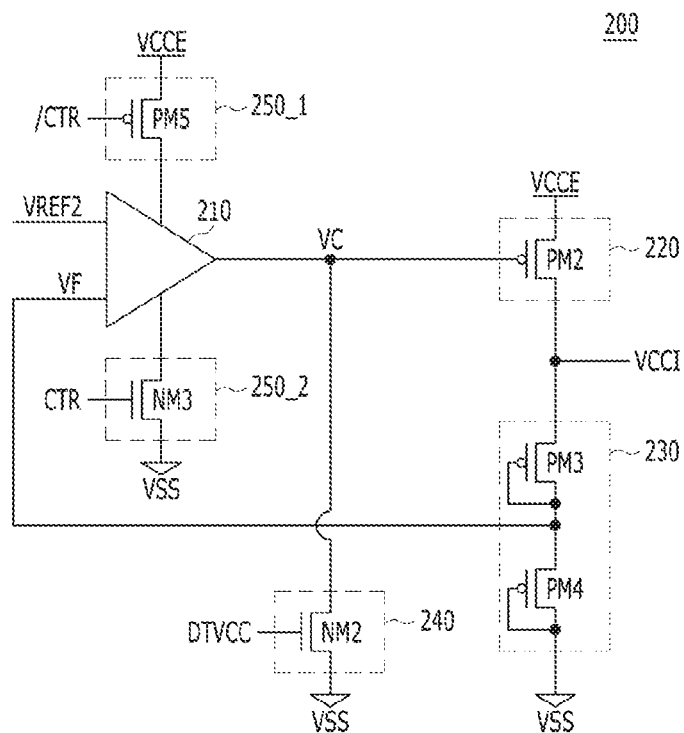
FIG. 4 is a diagram for illustrating a configuration of an internal voltage generation circuit of FIG. 2.

FIG. 4 is a diagram for illustrating a configuration of the internal voltage generation circuit 200 of FIG. 2.

Referring to FIG. 4, the internal voltage generation circuit 200 may include a comparison circuit 210, a driving circuit 220, a feedback circuit 230, a control circuit 240, and enable circuits 250_1 and 250_2.

First, the comparison circuit 210 may be an element that generates a control voltage VC by comparing a feedback voltage VF that corresponds to the internal power source voltage VCCI with a second reference voltage VREF2, that is, a preset reference voltage. More specifically, the comparison circuit 210 may receive the second reference voltage VREF2 through one input stage, may receive the feedback voltage VF through the other input stage, and may generate the control voltage VC through a comparison operation. Accordingly, when a voltage level of the feedback voltage VF is lower than a voltage level of the second reference voltage VREF2, the comparison circuit 210 may lower a voltage level of the control voltage VC.

The driving circuit 220 may be an element that drives the internal power source voltage VCCI as the external power source voltage VCCE based on the control voltage VC. More specifically, the driving circuit 220 may include a second PMOS transistor PM2 with a source and a drain that are coupled between a supply stage to which the external power source voltage VCCE is applied and an output stage from which the internal power source voltage VCCI is output and a gate to which the control voltage VC is input. In this case, the turn-on/off operation of the second PMOS transistor PM2 may be controlled based on the control voltage VC. Accordingly, when the second PMOS transistor PM2 is turned on, the internal power source voltage VCCI may be driven as the external power source voltage VCCE.

The feedback circuit 230 may be an element that generates the feedback voltage VF by dividing the internal power source voltage VCCI. More specifically, the feedback circuit 230 may include a third PMOS transistor PM3 and fourth PMOS transistor PM4 that are coupled in series between an output stage from which the internal power source voltage VCCI is output and the ground stage to which the ground power source voltage VSS is applied. The third PMOS transistor PM3 and the fourth PMOS transistor PM4 may be coupled in a diode type. Accordingly, the third PMOS transistor PM3 and the fourth PMOS transistor PM4 may output the feedback voltage VF by dividing the internal power source voltage VCCI. In this case, the feedback voltage VF may be output from a common node to which to the third PMOS transistor PM3 and the fourth PMOS transistor PM4 are coupled and may be fed back to the other input stage of the comparison circuit 210.

The control circuit 240 may be an element that controls the control voltage VC based on the power-off control signal DTVCC. More specifically, the control circuit 240 may include a second NMOS transistor NM2 with a source and a drain that are coupled between the ground stage to which the ground power source voltage VSS is applied, a node to which the control voltage VC is transferred, and a gate to which the power-off control signal DTVCC is input. In this case, the turn-on/off operation of the second NMOS transistor NM2 may be controlled based on the power-off control signal DTVCC. Accordingly, when the power-off control signal DTVCC is enabled at a logic level "high", for example, in the sudden power-off state, the second NMOS transistor NM2 may be turned on to drive the control voltage VC as the ground power source voltage VSS. When the control voltage VC is driven as the ground power source voltage VSS, the second PMOS transistor PM2 of the driving circuit 220 may be turned on, and thus, the internal power source voltage VCCI may be driven as the external power source voltage VCCE.

The enable circuits 250_1 and 250_2 may be elements that control the enable operation of the comparison circuit 210 based on the control signal CTR that is output by the control signal generation circuit 300 of FIG. 2. More specifically, the enable circuits 250_1 and 250_2 may include a fifth PMOS transistor PM5 with a source and a drain that are coupled between a supply stage to which the external power source voltage VCCE is applied and the comparison circuit 210, and the enable circuits 250_1 and 250_2 may include a third NMOS transistor NM3 with a source and a drain that are coupled between the comparison circuit 210 and the ground stage to which the ground power source voltage VSS is applied, respectively. In this case, the fifth PMOS transistor PM5 may receive the negative control signal/CTR through a gate thereof and may perform a turn-on/off operation. Furthermore, the third NMOS transistor NM3 may receive the control signal CTR through a gate thereof and may perform a turn-on/off operation. Accordingly, when the fifth PMOS transistor PM5 and the third NMOS transistor NM3 are turned on based on the negative control signal /CTR and the control signal CTR, respectively, the comparison circuit 210 may be enabled to perform an operation of comparing the feedback voltage VF and the second reference voltage VREF2.

Through the aforementioned configuration, the internal voltage generation circuit 200 may generate the internal power source voltage VCCI in the normal operation state. Furthermore, the internal voltage generation circuit 200 may drive the internal power source voltage VCCI as the external power source voltage VCCE during the enable period of the power-off control signal DTVCC in the sudden power-off state.

The semiconductor device may guarantee a stable circuit operation of the control signal generation circuit 300 of FIG. 2, which uses the internal power source voltage VCCI, by generating the internal power source voltage VCCI driven as the external power source voltage VCCE in the sudden power-off state. The control signal generation circuit 300 may generate the control signal CTR that corresponds to the external power source voltage VCCE in the sudden power-off state. Accordingly, stable circuit operations of the voltage detection circuit 100 to which the control signal CTR is input, the internal voltage generation circuit 200, and the reference voltage generation circuit 400 in FIG. 2 may be guaranteed in the sudden power-off state.

Figure 5:
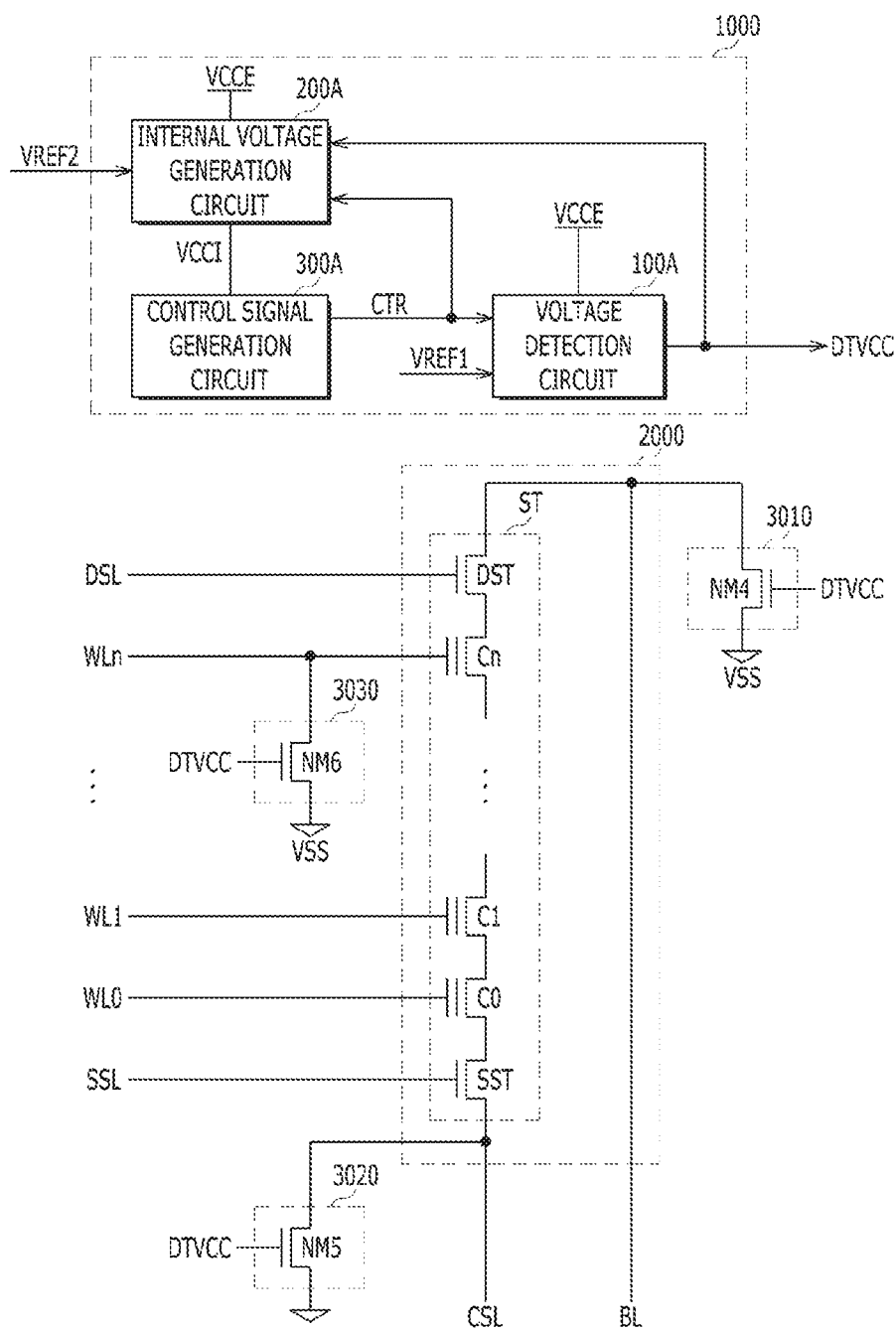
FIG. 5 is a block diagram for illustrating a configuration of a semiconductor memory device according to an embodiment.

FIG. 5 is a block diagram for illustrating a configuration of a semiconductor memory device according to an embodiment.

Referring to FIG. 5, the semiconductor memory device may include a sudden power detection circuit 1000, a memory cell array 2000, and discharging driving circuits 3010, 3020, and 3030.

First, the sudden power detection circuit 1000 may be an element that generates a power-off control signal DTVCC with a voltage level that corresponds to a voltage level of an external power source voltage VCCE in the sudden power-off state. The sudden power detection circuit 1000 may include a voltage detection circuit 100A, an internal voltage generation circuit 200A, and a control signal generation circuit 300A. In this case, the voltage detection circuit 100A, the internal voltage generation circuit 200A, and the control signal generation circuit 300A may correspond to the voltage detection circuit 100, the internal voltage generation circuit 200, and to the control signal generation circuit 300 in FIG. 2, respectively, and thus, a detailed configuration and operation of each of the elements will be omitted.

The memory cell array 2000 may be an element in which data is stored. The memory cell array 2000 may include a plurality of memory cells C0, C1, ... and Cn that are coupled between a bit line BL and a source line CSL and having gates thereof that are coupled to a plurality of word lines WL0, WL1, ... and Wn (wherein n is a natural number), respectively. The memory cell array 2000 may include a plurality of memory cell strings ST, each including the plurality of memory cells C0, C1, ... and Cn. One memory cell string ST is representatively illustrated in FIG. 5. The memory cell string ST may perform a program operation, a read operation or an erase operation based on a level of a voltage applied to the bit line BL, the source line CSL, and the plurality of word lines WL0, WL1, ... and Wn. Since the program operation, read operation, and erase operation of the memory cell string ST are publicly-known technologies, descriptions of detailed configurations and operations thereof are omitted.

For reference, the memory cell string ST may include a drain selection transistor DST with one end that is coupled to the bit line BL and turned on/off based on a drain selection signal DSL, and a source selection transistor SST with one end that is coupled to the source line CSL and turned on/off based on a source selection signal SSL. Furthermore, the memory cell string ST may include the plurality of memory cells C0, C1, ... and Cn that are coupled in series between the drain selection transistor DST and the source selection transistor SST. Furthermore, the plurality of memory cells C0, C1, ... and Cn may have gates thereof that are coupled to the plurality of word lines WL0, WL1, ... and Wn, respectively. Hereinafter, for convenience of description, the word line WLn of the plurality of word lines WL0, WL1, ... and Wn is representatively described.

The discharging driving circuits 3010, 3020, and 3030 may be elements that discharge at least one of the bit line BL, the source line CSL, and the word line WLn during the enable period of the power-off control signal DTVCC. The discharging driving circuits 3010, 3020, and 3030 may include a first discharging driving circuit 3010 that discharges the bit line BL based on the power-off control signal DTVCC, a second discharging driving circuit 3020 that discharges the source line CSL based on the power-off control signal DTVCC, and a third discharging driving circuit 3030 that discharges the word line WLn based on the power-off control signal DTVCC.

More specifically, the first discharging driving circuit 3010 may include a fourth NMOS transistor NM4 with a source and a drain that are coupled between a ground stage to which a ground power source voltage VSS is applied and the bit line BL and a gate to which the power-off control signal DTVCC is input. In this case, the fourth NMOS transistor NM4 may perform a turn-on/off operation based on the power-off control signal DTVCC. Accordingly, when the fourth NMOS transistor NM4 is turned on based on the power-off control signal DTVCC, the bit line BL may be discharged as the ground power to source voltage VSS.

The second discharging driving circuit 3020 may include a fifth NMOS transistor NM5 that is turned on based on the power-off control signal DTVCC. The third discharging driving circuit 3030 may include a sixth NMOS transistor NM6 that is turned on based on the power-off control signal DTVCC. Like the first discharging driving circuit 3010, the second and third discharging driving circuits 3020 and 3030 may discharge the source line SL and the word line WLn, respectively, as the ground power source voltage VSS based on the power-off control signal DTVCC.

The semiconductor memory device may generate the power-off control signal DTVCC, having a voltage level that corresponds to a voltage level of the external power source voltage VCCE, in the sudden power-off state. Accordingly, in the sudden power-off state, a discharging operation for the bit line BL, the source line SL, and the word line WLn that are coupled to the memory cell string ST may be stably guaranteed by the first to third discharging driving circuits 3010, 3020, and 3030.

Figure 6:
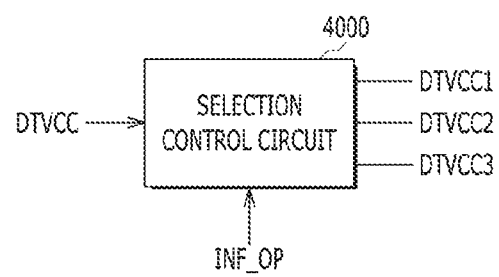
FIG. 6 is a block diagram for illustrating a semiconductor memory device according to another embodiment of the semiconductor memory device of FIG. 5.

FIG. 6 is a block diagram for illustrating a semiconductor memory device according to another embodiment of the semiconductor memory device of FIG. 5.

Referring to FIGS. 5 and 6, the semiconductor memory device may include a selection control circuit 4000 of FIG. 6, in addition to the sudden power detection circuit 1000, the memory cell array 2000, and the first to third discharging driving circuits 3010, 3020, and to 3030, which are illustrated in FIG. 5.

The selection control circuit 4000 may be an element that provides the power-off control signal DTVCC to at least one of the first to third discharging driving circuits 3010, 3020, and 3030 based on the operation information INF_OP of the memory cell array 2000 during normal operations. In this case, a first power-off control signal DTVCC1 may be a signal that is provided to the first discharging driving circuit 3010. A second power-off control signal DTVCC2 may be a signal that is provided to the second discharging driving circuit 3020. A third power-off control signal DTVCC3 may be a signal that is provided to the third discharging driving circuit 3030.

The operation information INF_OP may mean information that corresponds to an operation state of the memory cell array 2000 during normal operations before the sudden power-off state occurs. That is, the memory cell array 2000 may perform any one of a program operation, a read operation, and an erase operation before the sudden power-off state occurs. In this case, the operation information INF_OP may include information on an operation of the memory cell array 2000.

For example, assuming that the memory cell array 2000 performs a program operation or read operation before the sudden power-off state occurs, the operation information INF_OP may include information that corresponds to the program operation or read operation. In this case, the selection control circuit 4000 may selectively control a discharging operation for the word line WLn, for example, based on the operation information INF_OP. That is, the selection control circuit 4000 may output the power-off control signal DTVCC as the third power-off control signal DTVCC3 based on the operation information INF_OP. Accordingly, the third power-off control signal DTVCC3 may be selectively transmitted to the third discharging driving circuit 3030. That is, a discharging operation may be performed on the word line WLn in preference to the source line SL and the bit line BL.

The semiconductor memory device may selectively discharge at least one of the word line, the source line, and the bit line based on a program operation, a read operation, and an erase operation that are performed during normal operations in the sudden power-off state.

An embodiment of the present disclosure has an effect in that it can smoothly control a circuit to which a power-off control signal is provided, by generating the stable power-off control signal in the sudden power-off state.

An embodiment of the present disclosure has an effect in that it can increase the reliability of data, stored in a memory cell, by guaranteeing a stable discharging operation in the sudden power-off state.

Effects of the present disclosure are not limited to the aforementioned effects, and other effects not described above may be evidently understood by those skilled in the art, to which the present disclosure pertains, from the above description.

Although various embodiments have been described for illustrative purposes, it will be apparent to those skilled in the art that various changes and modifications may be made without departing from the spirit and scope of the disclosure as defined in the following claims.

What is claimed is:

1. A semiconductor device comprising:
a voltage detection circuit configured to enable a power-off control signal by detecting a voltage level of an external power source voltage;
an internal voltage generation circuit configured to receive the external power source voltage, generate an internal power source voltage by comparing the external power source voltage to a preset reference voltage, and drive the internal power source voltage as the external power source voltage during an enable period of the power-off control signal; and
a control signal generation circuit configured to generate a control signal with a voltage level that corresponds to a voltage level of the internal power source voltage and configured to control a circuit operation of the voltage detection circuit.

2. The semiconductor device of claim 1, further comprising a reference voltage generation circuit configured to generate the reference voltage,
wherein whether to enable a voltage generation operation of the reference voltage generation circuit is based on the control signal.

3. The semiconductor device of claim 1, wherein the voltage detection circuit comprises:
a distribution circuit configured to generate a distribution voltage by dividing the voltage level of the external power source voltage;
a comparison circuit configured to generate the power-off control signal by comparing the distribution voltage to the reference voltage; and
an enable circuit configured to control an enable operation of the comparison circuit based on the control signal.

4. The semiconductor device of claim 1, wherein the internal voltage generation circuit comprises:
a comparison circuit configured to generate a control voltage by comparing a feedback voltage that corresponds to the internal power source voltage with the reference voltage;
a driving circuit configured to drive the internal power source voltage as the external power source voltage based on the control voltage;
a feedback circuit configured to generate the feedback voltage by dividing the internal power source voltage;
a control circuit configured to control the control voltage based on the power-off control signal; and
an enable circuit configured to control an enable operation of the comparison circuit based on the control signal.

5. The semiconductor device of claim 1, further comprising an operation circuit configured to discharge a specific node during the enable period of the power-off control signal.

6. A semiconductor memory device comprising:
a sudden power detection circuit configured to generate a power-off control signal with a voltage level that corresponds to a voltage level of an external power source voltage, in a sudden power-off state;
a memory cell array configured to store data, and the memory cell array including a memory cell, having a gate that is coupled to a word line, coupled between a bit line and a source line; and
a discharging driving circuit configured to discharge at least one of the bit line, the source line, and the word line during an enable period of the power-off control signal, selectively.

7. The semiconductor memory device of claim 6, wherein the sudden power detection circuit comprises:
a voltage detection circuit configured to enable the power-off control signal by detecting the voltage level of the external power source voltage;
an internal voltage generation circuit configured to receive the external power source voltage, generate an internal power source voltage by comparing the external power source voltage to a preset reference voltage, and drive the internal power source voltage as the external power source voltage during the enable period of the power-off control signal; and
a control signal generation circuit configured to generate a control signal with a voltage level that corresponds to a voltage level of the internal power source voltage and configured to control a circuit operation of the voltage detection circuit.

8. The semiconductor memory device of claim 7, wherein the voltage detection circuit comprises:
a distribution circuit configured to generate a distribution voltage by dividing the voltage level of the external power source voltage;
a comparison circuit configured to generate the power-off control signal by comparing the distribution voltage to the reference voltage; and
an enable circuit configured to control an enable operation of the comparison circuit based on the control signal.

9. The semiconductor memory device of claim 7, wherein the internal voltage generation circuit comprises:
a comparison circuit configured to generate a control voltage by comparing a feedback voltage that corresponds to the external power source voltage with the reference voltage;

a driving circuit configured to drive the internal power source voltage as the external power source voltage based on the control voltage;

a feedback circuit configured to generate the feedback voltage by dividing the internal power source voltage;

a control circuit configured to control the control voltage based on the power-off control signal; and an enable circuit configured to control an enable operation of the comparison circuit based on the control signal.

10. The semiconductor memory device of claim 6, wherein the discharging driving circuit comprises:

a first discharging driving circuit configured to discharge the bit line based on the power-off control signal that is selectively inputted;

a second discharging driving circuit configured to discharge the source line based on the power-off control signal that is selectively inputted; and a third discharging driving circuit configured to discharge the word line based on the power-off control signal that is selectively inputted.

11. The semiconductor memory device of claim 10, further comprising a selection control circuit configured to provide the power-off control signal to at least one of the first to third discharging driving circuits based on an operation information of the memory cell array during a normal operation before the sudden power-off state occurs.

12. The semiconductor memory device of claim 11, wherein the operation information comprises information on at least one of a program operation, a read operation, and an erase operation.

* * * * *